(12) United States Patent
Hudyma

(10) Patent No.: US 6,426,506 B1
(45) Date of Patent: Jul. 30, 2002

(54) COMPACT MULTI-BOUNCE PROJECTION SYSTEM FOR EXTREME ULTRAVIOLET PROJECTION LITHOGRAPHY

(75) Inventor: Russell M. Hudyma, San Ramon, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/321,255

(22) Filed: May 27, 1999

(51) Int. Cl.⁷ .................................................. G21K 1/06
(52) U.S. Cl. ...................... 250/492.2; 378/34; 359/366; 359/859
(58) Field of Search ........................ 250/492.2; 378/34; 359/366, 859

(56) References Cited

U.S. PATENT DOCUMENTS 3,748,015 A * 7/1973 Offner ........................ 350/55
5,315,629 A * 5/1994 Jewell et al. ................. 378/34

* cited by examiner

Primary Examiner—Jack Berman
(74) Attorney, Agent, or Firm—John P. Wooldridge; Alan H. Thompson

(57) ABSTRACT

An optical system compatible with short wavelength (extreme ultraviolet) radiation comprising four optical elements providing five reflective surfaces for projecting a mask image onto a substrate. The five optical surfaces are characterized in order from object to image as concave, convex, concave, convex and concave mirrors. The second and fourth reflective surfaces are part of the same optical element. The optical system is particularly suited for ring field step and scan lithography methods. The invention uses aspheric mirrors to minimize static distortion and balance the static distortion across the ring field width, which effectively minimizes dynamic distortion.

20 Claims, 4 Drawing Sheets

COMPACT MULTI-BOUNCE PROJECTION SYSTEM FOR EXTREME ULTRAVIOLET PROJECTION LITHOGRAPHY

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

1. Field of the Invention

This invention is related to an optical system for use with short wavelength radiation in photolithography equipment.

2. Background of the Invention

Photolithography is a well-known manufacturing process used to create devices upon substrates. The process typically involves exposing a patterned mask to collimated radiation thereby producing patterned radiation, which is passed through an optical reduction system. The reduced patterned radiation or mask image is projected onto a substrate coated with photoresist. Radiation exposure changes the properties of the photoresist, allowing subsequent processing.

Exposure tools used in photolithography have two common methods of projecting a patterned mask onto a substrate: "step and repeat" and "step and scan." The step and repeat method sequentially exposes portions of a substrate to a mask image. The step and repeat optical system has a projection field that is large enough to project at least one die image onto the substrate. After each image exposure, the substrate is repositioned and the process is repeated.

In contrast, the step and scan method scans the mask or reticle onto a wafer substrate over an annular field or a slit field that is the full height of one or more of the dies. Referring to FIG. 1, a ring field lithography system 100 for use in the step and scan method is shown. A moving mask 101 is illuminated by a radiation beam 103, which reflects off the mask 101 and is directed through a reduction ring field optical system 107. Within the optical system 107, the image is inverted and the arcuate shaped ring field 109 is projected onto a moving substrate 111. The arcuate shaped reduced image ring field 109 can only project a portion of the mask 101, thus the reduced image ring field 109 must scan the complete mask 101 onto the substrate 111. Because the mask 101 and substrate 111 move synchronously, a sharp image is scanned onto the substrate 111. The dimensions of the arcuate slit are typically described by a ring field radius and a ring field width.

These step and scan ring field systems have less distortion than step and repeat systems because it is easier to correct distortion over the narrow slit width. Referring to FIG. 2, an image is projected by the optical system onto to wafer through an arcuate ring field slit 201, which is geometrically described by a ring field radius 203, a ring field width 205, and a length 207. Ring field coverage is up to 180° in azimuth 209.

As manufacturing methods improve, the minimum resolution dimension or critical dimension (CD) that can be achieved decreases, thereby allowing more electronic components or devices to be fabricated within a given area of a substrate. The number of devices that can be fabricated within an area of substrate is known as device density. With existing technology, 0.18 $\mu$m resolution is possible using projection systems designed to operate at either 248 or 193 nanometers. One well-known means of improving the resolution dimension and increasing device density is to use shorter exposure wavelength radiation during photolithography processes. The relationship between resolution (R) and radiation wavelength is described by the formula: $R=(K_1\lambda)/(NA)$, wherein R is the resolution dimension, $K_1$ is a process dependent constant (typically 0.7), $\lambda$ is the wavelength of the radiation, and NA is the numerical aperture of the optical system at the wafer plane. Either reducing the operating wavelength or an increasing in the numerical aperture will improve the resolution of the system.

Improving the resolution by increasing the numerical aperture (NA) has several drawbacks. The most prevalent drawback is the concomitant loss of depth of focus. The depth of focus determines, in part, the process latitude or the available "process window". A reduced depth of focus limits the available process window. The relationship between NA and depth of focus (DOF) is described by the formula: $DOF=(K_2\lambda)/NA^2$, wherein DOF is depth of focus, and $K_2$ is a process dependent constant (typically close to unity). This simple relationship shows the inverse relationship between DOF and NA. For several reasons, including practical wafer flatness and scanning stage errors, a large depth of focus is on the order of 1.0 micrometers is desirable.

There is a rapid loss in DOF as the NA is increased. It is preferable to use shorter wavelengths combined with a low NA to maximize resolution and available DOF simultaneously. A state-of-the-art extreme ultraviolet (EUV) projection system operating at 13.4 nm achieves a 100 nm resolution (assuming $K_1$=0.7) with a depth of focus of 1.0 $\mu$m at a NA of 0.10. This large depth of focus improves process latitude, thus enhancing the "process window". In contrast, a deep ultraviolet (DUV) wavelength projection lithography optical system operating at a wavelength ($\lambda$) of 193 nm can only achieve a minimum critical dimension of 180 nm at a numerical aperture of 0.75, assuming the same value for the process dependent constant $K_1$. Further, the depth of focus of the DUV optical system is reduced to 0.34 $\mu$m, resulting in a loss of process latitude that adversely impacts device yield. As the process window shrinks, it becomes more difficult to maintain the CD control required for high-density integrated circuits in commercial production.

To produce integrated circuits with ever smaller critical dimensions and higher device density with sufficient process latitude for volume manufacture, it is necessary to develop projection systems operating at extreme ultraviolet (EUV) wavelengths (from 4 to 20 nm). Radiation at these wavelengths must be focused using mirrors coated with multilayer coatings that have high reflectivity at near normal incidence angles. The reflection of radiation off of a mirror is known as "bounce".

State of the art EUV imaging systems have relatively low numerical apertures in the range of 0.08 to 0.10 and can resolve features on the order of 100 nm. To extend the resolution of EUV lithography below 100 nm, optical systems having higher numerical apertures are needed. Increasing the numerical aperture of current EUV designs results in a substantial degradation in the residual wavefront error, making these designs unsuitable for projection lithography.

Prior art contains few examples of high (>0.10) numerical aperture designs suitable for EUV lithography. An optical system that is usable in the extreme ultraviolet portion of the spectrum is disclosed in U.S. Pat. No. 5,315,629 to Jewell et al., which is herein incorporated by reference. The '629 patent discloses a four mirror design with a numerical aperture of 0.10 and a ring field width of 0.5 mm. The design has diffraction-limited performance with approximately 10 nanometers of static distortion at the edge of its 0.5 mm ring field. The disclosure states that the numerical aperture of the optical system can be increased to approximately 0.14 without loss in image quality, if the image distortion tolerance is relaxed. The increase in numerical aperture would enable the design to resolve features less than 100 nanometers. However, as this design is re-optimized to minimize the residual wavefront error, the ability to correct distortion over any meaningful ring field width is lost. For example, the residual distortion at a numerical aperture of 0.14 is on the order of 30–40 nm at the edge of the 0.5 mm ring field. This is too much distortion for a practical lithographic projection, even when the effects of scan-averaging are included.

An optical system that is usable in the extreme ultraviolet portion of the spectrum is disclosed in U.S. Pat. No. 5,212,588 to Viswanathan et al., which is herein incorporated by reference. The '588 patent demonstrate a multi-bounce projection system that incorporates two coaxial aspheric mirrors in a 4-bounce arrangement, where mirror M1 is convex and mirror M2 is concave. To obtain high resolution imagery, the field curvature needs to be corrected to substantially zero so that the imaging surface is perfectly flat. The '588 projection system is designed so that the two mirrors have substantially the same radius of curvature. Since M1 is convex and M2 is concave, the flat field condition is automatically satisfied (the Petzval sum is made almost identically zero). While the '588 patent describes a number of embodiments with excellent performance, all the designs suffer one disadvantage in that the exit pupil is centrally obscured. This central obscuration is undesirable since it will degrade resolution and reduce the process latitude for the variety of complex geometries that must be patterned.

In view of the foregoing, there is a need for an optimized optical system that is compatible with short wavelength radiation and has a high numerical aperture for improved resolution, and which addresses the above and other problems.

SUMMARY OF THE INVENTION

The present invention is directed to a catoptric optical system that is used to project a reduced mask image onto a wafer with short wavelength radiation. The preferred embodiment comprises an optical system having four mirrored surfaces in a novel five bounce configuration. The imaging bundle is reflected off of one of the mirrored surfaces, mirror M2, twice. The present invention allows for higher device density because the optical system has improved resolution that results from the relatively high numerical aperture. The optical system is designed to have a numerical aperture of approximately 0.15 and operate at a wavelength of approximately 13.1 nm. Under these conditions, resolution on the order of 50 nm can be achieved.

An embodiment of the present invention also includes a well-defined accessible aperture stop that helps to ensure that the imagery is stationary. Illuminated properly, this projection system should have no variation in critical dimension across the field due to vignetting or clipping of the imaging bundles.

Further, an embodiment of the present invention has a balanced static centroid distortion curve across the ring field width. More specifically, the centroid distortion levels at the edges of the ring field width are substantially equal and quantitatively higher than the centroid distortion at the center of the ring field width. By balancing the static centroid distortion curve across the ring field width, the dynamic scan-averaged distortion is minimized.

The mirrors are arranged so that the negative contribution to the Petzval sum from the two reflections off mirror M2 is corrected by the single bounce from mirror M3 and the single bounce from mirror M4. The remaining net negative sum is corrected using mirror M1, which has comparatively little optical power. To minimize the Petzval sum, the radii of mirrors M2, M3, and M4 are approximately equal. The spacing between the mirrors is set so that the imaging bundles are unobscured at the chosen reduction ratio. To minimize the residual wavefront error, all four reflective surfaces of the inventive optical system are aspheric.

Other advantages and features of the present invention will become apparent from a reading of the following description when considered in conjunction with the accompanying drawings of which the following is a brief description.

DESCRIPTION OF THE PREFERRED EMBODIMENT

Figure 1:
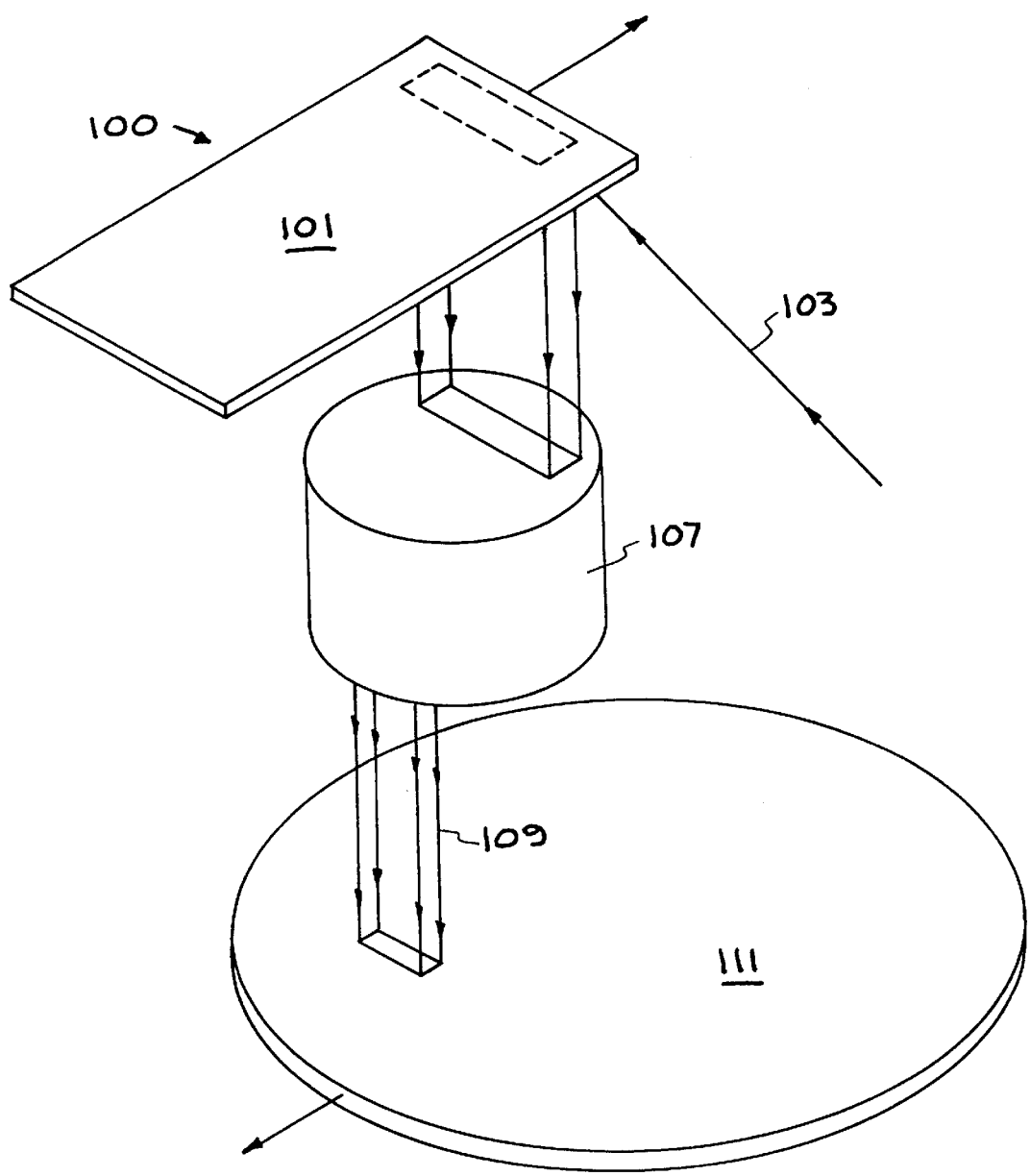
FIG. 1 is a view of a ring field lithography system.
Figure 2:
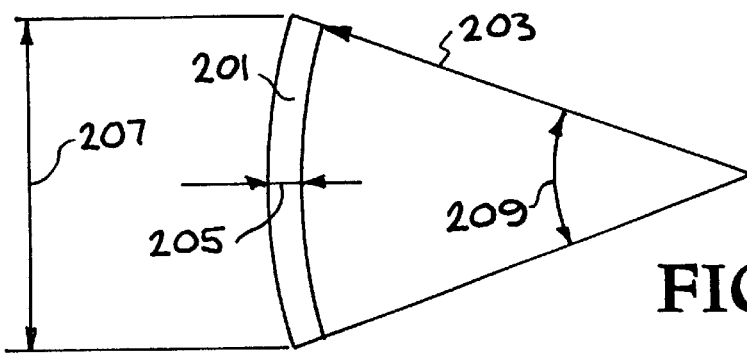
FIG. 2 is a view of a ring field slit.

The following is a detailed description of the presently preferred embodiments of the present invention. However, the present invention is in no way intended to be limited to the embodiments discussed below or shown in the drawings. Rather, the description and the drawings are merely illustrative of the presently preferred embodiments of the invention.

Figure 3:
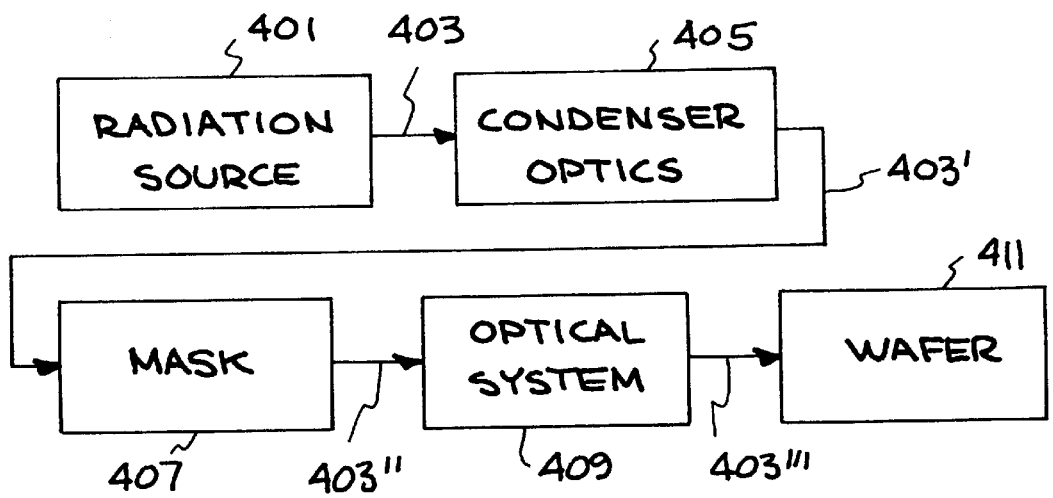
FIG. 3 is a schematic depiction of the main elements of the exemplary EUV lithography apparatus according to the present invention.

The present invention is a photolithography optical system designed for use with extreme ultraviolet (EUV) radiation. FIG. 3 schematically depicts the exemplary inventive apparatus for semiconductor EUV lithography. The apparatus comprises a radiation source 301 that emits EUV radiation 303. The EUV radiation 303 may be processed by a condenser 305 to produce an EUV beam 307 to uniformly illuminate a portion of a mask 309. The radiation reflected from the mask 309 produces a patterned EUV beam 311, which is introduced into an optical system 313. The optical system 313 projects a reduced image 315 of the mask 309 onto a wafer 317.

EUV radiation has a wavelength ($\lambda$) between about 4 to 20 nm and may be produced by any suitable means including a laser produced plasma, synchrotron radiation, electric discharge sources, high-harmonic generation with femtosecond laser pulses, discharge-pumped x-ray lasers, and electron-beam driven radiation devices. The sources may be continuous or pulsed. Laser-produced plasma (LPP) sources focus an intense pulsed laser beam onto a target. Suitable targets are metals and noble gases. Targets of noble gas molecule clusters in a supersonic jet produce a bright "spark" with a broad emission spectrum ranging from visible light to EUV radiation. High-repetition-rate (3,000–6,000 Hz) pulsed laser drivers deliver 1,500 W of focused power to the target regions. A LPP gas source converts the incident laser power into EUV light in the required spectral bandwidth.

Condenser optics typically collect EUV radiation from the LPP source and condition the radiation to uniformly illuminate the mask. The condenser illuminates a narrow ring field at the mask with the EUV radiation, where the illumination must have a spatial nonuniformity of less than 1% in the cross scan dimension. The condenser further directs the EUV beam into the entrance pupil of the optical system with a partial coherence of approximately 0.7. Separate collection channels each act in concert to direct radiation across the entire ring field and the optical system entrance pupil.

Since EUV radiation is absorbed by all materials, reflective optical elements rather than refractive elements are best suited for EUV optical systems. The inventive optical system comprises four reflective optical elements (mirrors) listed in order from mask to wafer: M1, M2, M3, and M4. The optical system is placed in a vacuum or other suitable atmosphere.

In the lithographic process, the EUV radiation is collected and illuminates a mask, producing an image that can be projected to the wafer. The object end of the inventive optical system departs enough from the telecentric condition so that the light rays incident upon the reflective mask have sufficient clearance to prevent vignetting or clipping by mirror edges.

Figure 4:
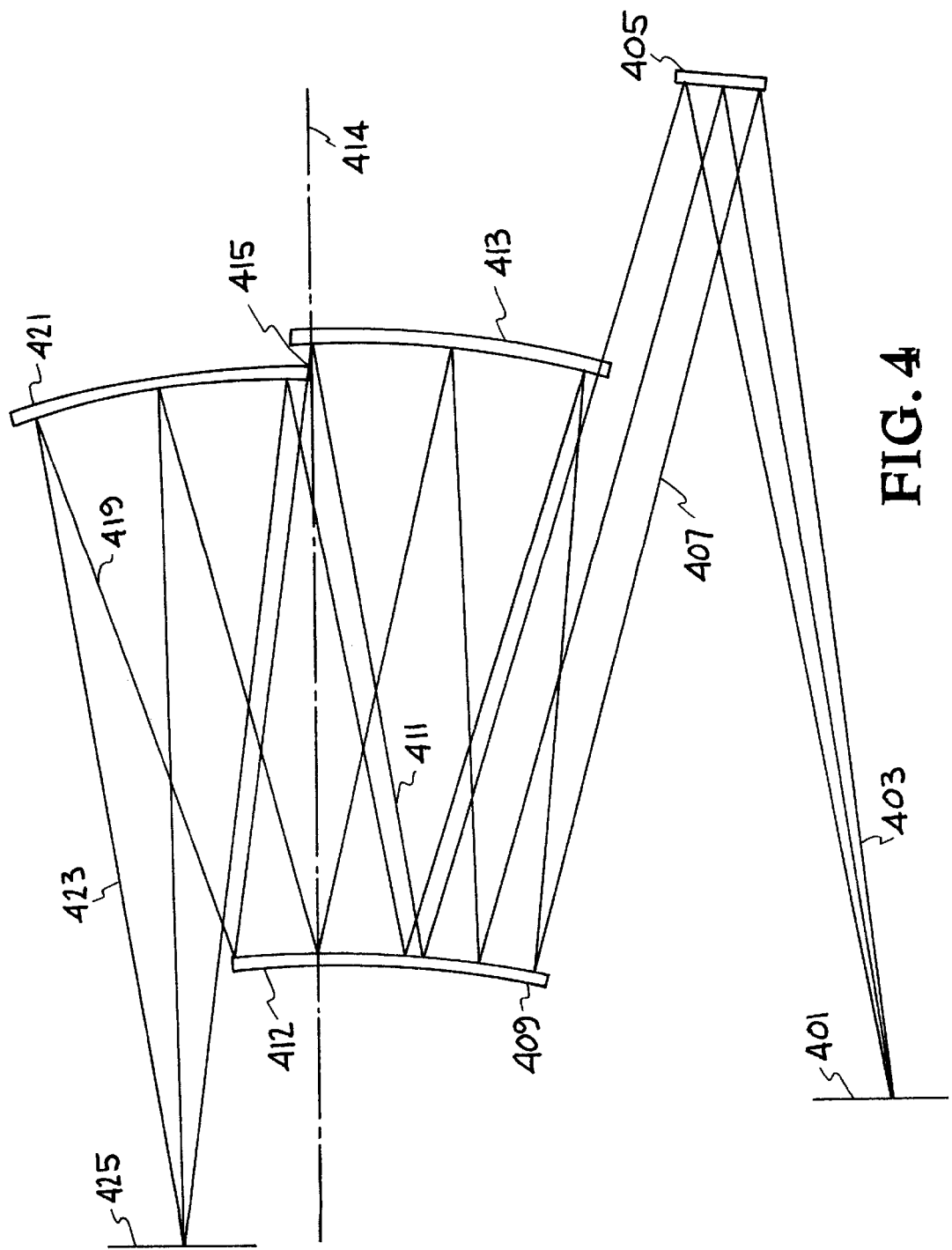
FIG. 4 is a view of the optical system according to the present invention.

Referring to FIG. 4, there is shown an exemplary optical system for EUV semiconductor lithography. The optical elements are all arranged in a coaxial configuration such that the vertex of each surface of revolution lies on a common centerline 414. Only off-axis sections of each mirror are used. Because this is a ring field optical configuration, only off-axis sections of the parent mirrors are utilized as shown in FIG. 4. Thus, the off-axis section of the first optical element (M1) 405, the off-axis section of the second optical element (M2) 409, the off-axis section of the third optical element (M3) 413, and the off-axis section of the four optical element (M4) 421 are exposed to EUV radiation. The use of off-axis sections, which are smaller in area than the full aspheric parent mirrors, facilitates the deposition uniform reflective multilayer coatings. The ability to achieve the required uniform layer thickness is enhanced as the reflective area of the mirror is decreased.

EUV Beam 1 403 diverges from a reflective mask 401 onto concave aspheric mirror M1 405. Beam 2 407 is reflected from mirror M1 405 in a divergent cone to a convex aspheric mirror M2 409. Beam 3 411 is reflected from mirror M2 409 in a divergent cone to a concave aspheric mirror M3 413. Beam 4 415 is reflected from mirror M3 413 in a convergent cone back to convex aspheric mirror M2 409. At this location, the aperture stop 412 is place on the mechanical centerline 414 of the optical system. Beam 5 419 is reflected from mirror M2 409 in a divergent cone to a concave aspheric mirror M4 421. Beam 6 423 is reflected from mirror M4 421 in a convergent cone forming a reduced image of the mask 401 pattern onto a wafer 425. The projected EUV aerial image enables a chemical reaction in a photoresist layer on the wafer 425 forming the latent image in the photoresist. This latent image is then subsequently processed by well-known means to form the patterned wafer.

Concave mirrors have positive optical power and convex mirrors have negative optical power. Using this convention, the optical power configuration of the inventive system from object to image (including the double bounce from mirror M2 409 ) can be described as: positive, negative, positive, negative and positive, corresponding to mirrors M1 405, M2 409 (first bounce), M3 413, M4 409 (second bounce), and M4 421, respectively. This configuration of alternating positive and negative optical powers allows the optical system to achieve a Petzval sum that is approximately zero, while enabling correction of both astigmatism and distortion.

Since the focal length of the inventive optical system can be scaled to accommodate a variety of packaging concepts, it is useful to describe the inventive optical system relative to this quantity. In the preferred embodiment, the absolute radii of the mirrors M1 405, M2 409, M3 413, and M4 417, relative to the system focal length, are listed in Table 2.

TABLE 2

| Reflective Surface | Reflective surface radii from object plane to image plane as a fraction of the system focal length ± 10% |
|---|---|
| M1 | 5.1613 |
| M2 | 1.0819 |
| M3 | 1.2735 |
| M4 | 1.1411 |

Referring to Table 3, the relative positions of the mirrors M1 405, M2 409 (first bounce), M3 413, M2 409 (second bounce), and M5 421 for the preferred embodiment are listed. For a 4-to-1 reduction, the distance of the mask 401 to M1 405 is 388.845 mm.

TABLE 3

| Surface | Axial separations of the mirrors as a fraction of the system focal length ± 10% |
|---|---|
| M1 to M2 | 0.8671 |
| M2 to M3 (first bounce) | 0.6006 |
| M3 to M2 | 0.6006 |
| M2 to S4 (second bounce) | 0.5655 |
| M4 to image | 0.8559 |

EUV multilayers are constructed using alternating layers of two materials with different optical properties. These materials need to have low intrinsic absorption at EUV wavelengths and provide an optical impedance mismatch at the layer interfaces so that reflected waves can be generated. Common material pairs with desirable reflectance characteristics include molybdenum/silicon (Mo/Si) for wavelengths near 13.4 nm and molybdenum/beryllium (Mo/Be) for wavelengths near 11.3 nm.

Since the optical impedance between these material pairs is low, many layer pairs are required to achieve a useful reflectance. The multilayer mirror may be designed for specific radiation wavelengths and incidence angles. As the reflectance of the multilayer stack is maximized with the addition of multilayer pairs, the reflectance of the multilayer mirrors may be affected by variations in the radiation wavelength and angle of incidence.

The multilayer mirror may only have a narrow wavelength bandwidth that produces maximum reflectance. This narrow spectral bandwidth means that the multilayer reflectance is, for a fixed angle of incidence, sensitive to shifts in the incident radiation wavelength. The multilayer mirror reflectance may decrease if the incident radiation wavelength deviates outside the mirror's maximum reflectance bandwidth.

In an EUV optical system, the multilayer mirror reflectance may also be affected by the radiation incidence angle.

Although multilayer mirrors may be designed to maximize reflectance for a specific incidence angle, this maximum reflectance may only exist over a narrow range proximate to the design incidence angle. A multilayer mirror optimized for perpendicular radiation may produce maximum reflectance over a wider range of incidence angles than a mirror specifically designed for more acute incidence angles. The reflectance can decrease significantly when the incidence angle deviates outside the multilayer's angular bandwidth.

The ability of mirrors to equally reflect radiation over a range of incidence angles can be important because rays passing through an optical system may not impinge upon mirrors at the same angle across the beam width. The projected beam of an EUV optical system converges and expands, the individual rays of the beam do not travel in parallel paths. Maximum reflectivity over a wider range of ray angles can be maintained by configuring all mirrors so that the mean incidence angles are close to perpendicular. An embodiment of the present invention utilizes a mirror system configuration having near perpendicular or low mean incidence angles. Low mean incidence angles at each mirror ensures that the optical system transmission, which is described by the formula $T_{sys}=R_1 \times R_2 \times \ldots \times R_i$, where $R_i$ represents the reflectivity of the $i^{th}$ mirror, will be maximized. Low mean incidence angles also help to ensure that multilayer amplitude and phase effects as measured in the exit pupil of the projection system have little or no impact on imaging performance. These amplitude and phase effects can substantially alter the partially coherent imaging characteristics of the system, thus limiting the ability to control the CD across the field format.

Table 4 shows the mean incidence angles of each mirror surface for a preferred embodiment of the present invention. Multilayer coatings that have either a uniform or graded thickness can be designed and applied to each of the mirror surfaces to maximize the EUV transmission of the inventive five bounce system. The maximum EUV transmission of the inventive optical system may be greater than 17% if the reflectance of the mirrors is greater than 70%, which is close to the maximum theoretical reflectance of a Mo/Si multilayer mirror.

TABLE 4

| Mirror | Mean Incidence Angle |
|---|---|
| M1 | 12.4° |
| M2 | 9.0° |
| M3 | 7.3° |
| M4 | 14.0° |
| M5 | 7.0° |

Table 5 shows the maximum aspheric departure from a best-fit spherical surface centered on the off-axis section of each mirror of the preferred embodiment. The table has two entries for mirror M2, one corresponding to each reflection surface of M2, since there are two instantaneous clear apertures on this surface. The inventive optical system is designed using low aspheric departures across the off-axis section of the parent to facilitate mirror metrology using visible wavelengths. The off-axis sections of the present projection system can be designed so that the aspheric departures are small relative to a visible wavelength. Mirrors having small aspheric departures can be tested at their centers of curvature without the need for null optics that adversely impact the absolute accuracy of metrology testing.

TABLE 5

| Mirror | Maximum aspheric departure |
|---|---|
| M1 | <6.5 μm |
| M2 (first bounce) | <12.6 μm |
| M3 | <1.5 μm |
| M2 (second bounce) | <0.5 μm |
| M5 | <7.8 μm |

In another embodiment, the inventive optical system has a physically accessible, real aperture stop on mirror M4. The physical aperture stop ensures that imaging bundles from each field point within the ring field are not clipped or vignetted and are formed in the small manner. The physical aperture stop also makes the projected imagery, setting aside the effects of the field dependent aberrations and variations in illumination from the condenser across the ring field, independent of position within the ring field. The aerial images from different field points in the ring field will look the same and variations in projected feature size will be minimized. This type of projected imagery is known as "stationary imagery".

Tables 7, 8, and 9 contain constructional data and other relevant information for the currently preferred configuration of mirrors M1, M2, M3, and M4. The inventive as a 4:1 reduction ratio, a numerical aperture of 0.15, and a 0.5 mm ring is capable of 50 nm resolution and depth of focus of approximately 0.6 μm.

Referring to Table 7, parameters describing the mirror surfaces of the preferred embodiment are listed. Note that surface 2 and surface 4 describe the first and second bounces from mirror M2, respectively. The radius of curvature refers to the radius of curvature of each optical element, and the thickness refers to the vertex-to-vertex thickness between the optical surfaces. For example, the thickness of the object is 388,8452 mm and represents distance from the mask to the vertex of mirror M1.

TABLE 7

| Surface Number | Radius of Curvature | Thickness | Element Definition |
|---|---|---|---|
| Object | Infinite | 388.8452 | Mask |
| 1 | A(1) | −329.6116 | M1 |
| 2 | A(2) | 228.2796 | M2 (first bounce) |
| 3 | A(3) | −228.2796 | M3 |
| 4 | A(2) | 214.9420 | M2 (second bounce) |
| 5 | A(5) | −325.3325 | M4 |
| Image | Infinite | | Wafer |

Referring to Table 8, the aspheric parameters A(1)–A(4) for the optical elements M1, M2, M3, and M4 are set forth for a preferred embodiment. The aspheric profile of each mirror is uniquely determined by its K, A, B, C, and D values.

TABLE 8

| Asphere | CURV | K | A | B | C | D |
|---|---|---|---|---|---|---|
| A(1) | −0.00050972 | 8.124574 | 0.0 | −3.7218E−15 | 7.1103E−20 | −5.6845E−25 |
| A(2) | −0.00243176 | 1.036632 | 0.0 | 4.0876E−15 | 2.1809E−19 | 0.0000E+00 |
| A(3) | −0.00206582 | 0.051920 | 0.0 | 3.0920E−16 | 1.4981E−20 | −1.4479E−25 |
| A(4) | −0.00230546 | 0.191661 | 0.0 | −4.3963E−16 | 1.1452E−20 | −4.3459E−25 |

The sag of the aspheric surface (through 10th order) parallel to the z-axis (z) is a function of radial coordinate (h) given by Equation (1) wherein h is the radial coordinate, is the curvature of the surface (1/R), and A, B, C, and D are the 4th, 6th, 8th, and 10th order deformation coefficients, respectively. Mirrors M1, M3, and M4 are all oblate spheroids with $6^{th}$, $8^{th}$, and $10^{th}$ order polynomial deformations. The reflective surfaces of M2 are oblate spheroids with $6^{th}$ and $8^{th}$ horder polynomial deformations.

$$z = \frac{ch^2}{1+\sqrt{1-(1+k)c^2h^2}} + Ah^4 + Bh^6 + Ch^8 + Dh^{10}$$

Table 9 gives first order data for the preferred embodiment of the inventive optical system.

TABLE 9

| | |
|---|---|
| Center of ring field (mask, mm) | −211.0 |
| Effective focal length (mm) | 380.10 |
| Paraxial reduction ratio | 0.25 |
| Finite F/N$_o$ | f/3.34 |
| Total track (mm) | −51.16 |

Figure 5:
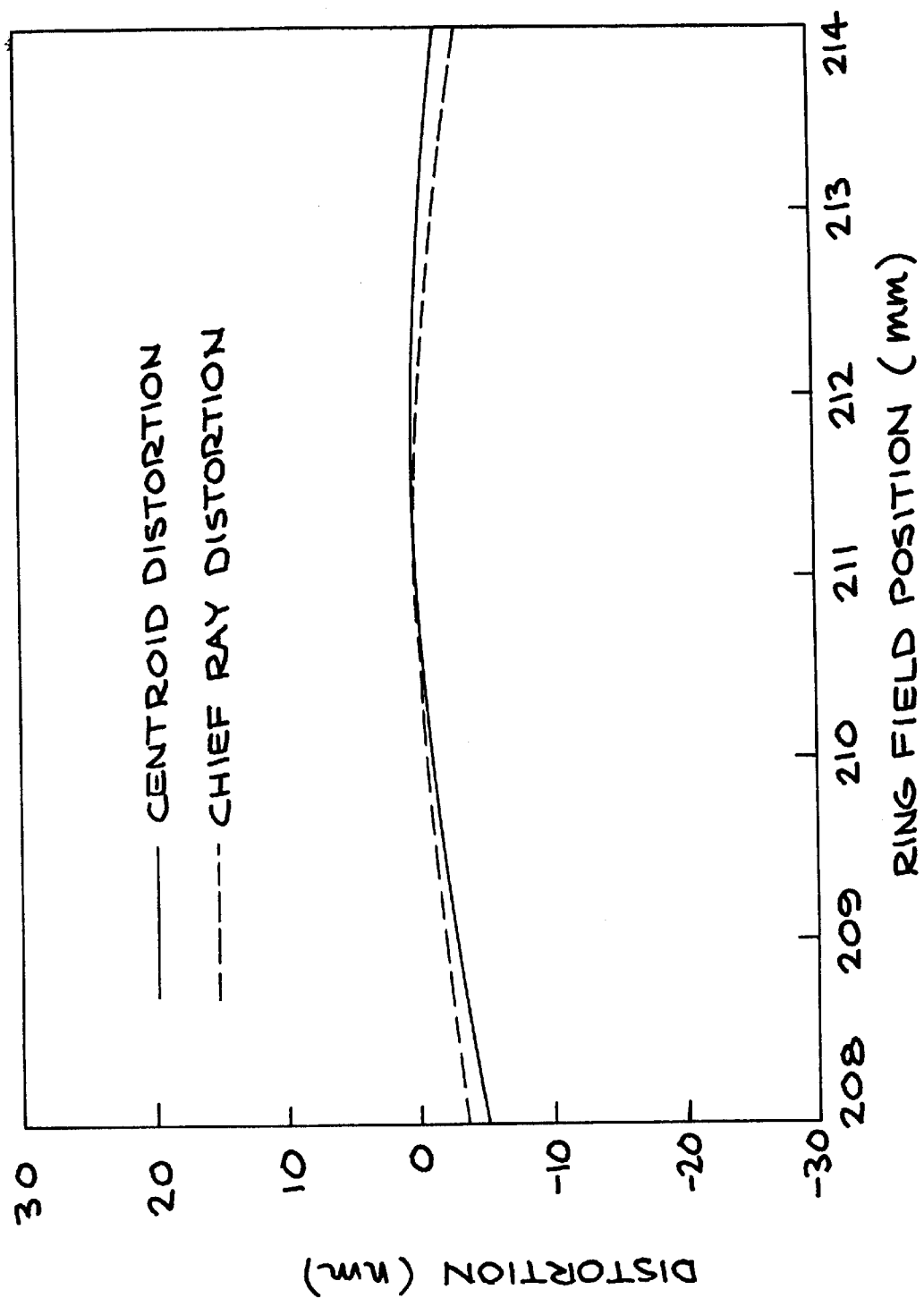
FIG. 5 is a graph showing distortion v. position across the ring field width.

Another advantage of the present invention is that the centroid distortion is balanced across the ring field width. As shown in FIG. 5, "balanced" means that the variation in static distortion across the width of the ring field is quadratic. In scanning lithography, the entire wafer field is covered by synchronously scanning both the mask and wafer across the projected ring field. Excessive or unbalanced static distortion can cause the time-averaged printed image to be blurred or smeared along a field-dependent trajectory. This leads to image properties that are field invariant in the scan direction, but which vary in the perpendicular or cross-scan dimension. By creating a static distortion field that varies quadratically across the ring field (i.e., "balancing" the static distortion), both the blurring (smearing) and placement (dynamic distortion) are minimized.

Table 10 shows the performance of the system as described by the root mean square (RMS) wavefront error and corresponding Strehl ratio.

TABLE 10

| Ring field Radius (mm) | rms wavefront error ($\lambda$ = 13.1 nm) | Strehl Ratio |
|---|---|---|
| 52.500 | 0.022 $\lambda$ | 0.981 |
| 52.625 | 0.017 $\lambda$ | 0.988 |
| 52.750 | 0.014 $\lambda$ | 0.993 |
| 52.875 | 0.012 $\lambda$ | 0.994 |
| 53.000 | 0.012 $\lambda$ | 0.994 |

Table 11 shows the deviation (distortion) of the image centroid at the wafer from its ideal location.

TABLE 11

| Ideal image point (mm) | Chief ray distortion (nm) | Centroid distortion (nm) |
|---|---|---|
| 52.500 | 9.95 | 11.90 |
| 52.550 | 6.50 | 7.80 |
| 52.600 | 3.78 | 4.46 |
| 52.650 | 1.78 | 1.87 |
| 52.700 | 0.53 | 0.06 |
| 52.750 | 0.01 | −0.98 |
| 52.800 | 0.24 | −1.24 |
| 52.850 | 1.22 | −0.72 |
| 52.900 | 2.96 | 0.60 |
| 52.950 | 5.46 | 2.71 |
| 53.000 | 8.73 | 5.62 |

Since the inventive optical projection system has an odd number of reflections, the mask and wafer are located of the same side of the imaging system. This introduces a limitation on the wafer travel. In the preferred configuration, the separation of the mask and wafer in the scan plane is 263.75 mm. The skilled artisan will readily appreciate that the entire optical system can be scaled by a constant greater than 1.0 to increase the separation between the mask and wafer. For example, if the inventive optical system were scaled by a factor of 1.5×, the mask to wafer separation would be almost 400 mm. When the optical system is scaled, the incidence angles remain the same and the compatibility of the design with multilayer coatings is unaffected. However, the distortion, wavefront error measured in waves, and the mirror asphericity increases proportionally to the scale factor. The limits imposed by mirror fabrication technology and the associated mirror metrology may limit the scale factor that can be used to increase the mask to wafer separation.

While the present invention has been described in terms of a preferred embodiment, those skilled in the art will readily appreciate that numerous modifications, substitutions and additions may be made to the disclosed embodiment without departing from the spirit and scope of the present invention. For example, although an optical system has been described above for use with a semiconductor photolithography system, those skilled in the art will readily appreciate that the inventive optical system may be utilized in any similar lithography device and that the present invention is in no way limited to the mechanisms described above.

Similarly, the skilled artisan will readily appreciate that the optical system shown in FIG. 4 is in no way limited to use with a particular type of lithography system or a particular lithography machine. Those skilled in the art will also readily appreciate that the optical system may be used with any similar lithography mechanism. It is intended that all such modifications, substitutions and additions fall within the scope of the present invention, which is best defined by the claims below.

What is claimed is:

1. A scanning ring field lithography apparatus for patterning images on a substrate, comprising:

a radiation source emitting extreme ultraviolet radiation having a wavelength ranging from approximately 4 to 30 nanometers;

a condenser;

a mask for generating patterned images; and reflective focusing optics positioned between the mask and the substrate, comprising four optical elements providing five reflective surfaces, the reflective focusing optics configured for projecting a reduced focused image on the substrate in the shape of an arcuate slit.

2. The apparatus of claim 1, wherein the five reflective surfaces are characterized as concave, convex, concave, convex and concave, when viewed in order from object to image.

3. The apparatus of claim 1, wherein the second reflective surface and the fourth reflective surface are part of a common optical element.

4. The apparatus of claim 1, wherein at least three of the five reflective surfaces of the reflective focusing optics are aspheric surfaces.

5. The apparatus of claim 1, wherein the reflective surfaces are coaxial with respect to each other.

6. The apparatus of claim 1, wherein the first reflective surface deviates from a best fitting spherical surface by less than approximately 6.50 μm, the second reflective surface deviates from a best fitting spherical surface by less than approximately 12.60 μm, the third reflective surface deviates from a best fitting spherical surface by less than approximately 1.50 μm, the fourth reflective element deviates from a best fitting spherical surface by less than approximately 0.50 μm, and the fifth reflective element deviates from a best fitting spherical surface by less than 7.80 μm.

7. The apparatus of claim 1, wherein the extreme ultraviolet radiation passes through the reflective focusing optics and is telecentric at the substrate.

8. The apparatus of claim 1, wherein an aperture stop is accessibly located proximate to the fourth reflective surface.

9. The apparatus of claim 1, wherein the numerical aperture of the reflective focusing optics is between approximately 0.10 and 0.15.

10. The apparatus of claim 1, wherein the mask is reflective and is positioned on the same side of the reflective focusing optics as the substrate.

11. The apparatus of claim 1, wherein the chief ray angle of radiation at the mask is less than approximately 7.5 degrees.

12. The apparatus of claim 1, wherein the reflective focusing optics are characterized by a balanced static centroid distortion curve across the width of the arcuate slit.

13. A method of projecting a mask image onto a substrate using a scanning ring field lithography apparatus, comprising:

producing extreme ultraviolet radiation having a wavelength ranging from approximately 4 to 30 nanometers;

condensing the radiation and directing it to a mask;

patterning the condensed radiation with the mask;

reducing the patterned radiation with reflective focusing optics comprising four optical elements and five reflective surfaces; and projecting a focused image on the substrate in the shape of an arcuate slit.

14. The method of claim 13, further comprising exposing a photoresist layer coated on the substrate with the reduced patterned radiation.

15. The method of claim 13, wherein reducing the patterned radiation is carried out by the five reflective surfaces characterized as concave, convex, concave, convex and concave when viewed from object to image.

16. The method of claim 13, wherein reducing the patterned radiation is carried out using a common optical element as the second reflective surface and the fourth reflective surface.

17. The method of claim 13, wherein the extreme ultraviolet radiation passes through the reflective focusing optics and is telecentric at the substrate.

18. The method of claim 13, further comprising positioning the mask on the same side of the reflective focusing optics as the substrate.

19. The method of claim 13, further comprising directing the radiation at the mask having a chief ray angle less than approximately 7.5 degrees.

20. The method of claim 13, further comprising producing extreme ultraviolet radiation from a source selected from the group consisting of pulsed sources and continuous sources.

* * * * *